United States Patent

Mohr et al.

Patent Number: 5,436,106
Date of Patent: Jul. 25, 1995

[54] PROCESS FOR THE PRODUCTION OF A COLOR TEST IMAGE USING QUINONE DIAZIDE PHOTOSENSITIVE RECORDING MATERIAL

[75] Inventors: Dieter Mohr, Budenheim; Martin Benzing, Biebelnheim; Juergen Mertes, Ingelheim; Guenter Hultzsch, Wiesbaden; Ine Gramm, Wiesbaden; Manfred Michel, Wiesbaden; Andreas Elsaesser, Idstein, all of Germany; Shane Hsieh, Bridgewater, N.J.; David L. Siegfried, Langhorne, Pa.

[73] Assignee: Hoechst Aktiengesellschaft, Frankfurt, Germany

[21] Appl. No.: 273,071

[22] Filed: Jul. 11, 1994

Related U.S. Application Data

[60] Division of Ser. No. 939,909, Sep. 4, 1992, Pat. No. 5,348,833, which is a continuation-in-part of Ser. No. 664,753, Mar. 5, 1991, abandoned.

[30] Foreign Application Priority Data

Mar. 5, 1990 [DE] Germany .......................... 40 06 856.0

[51] Int. Cl.⁶ .................... G03F 7/105; G03F 7/30
[52] U.S. Cl. .................... 430/143; 430/257; 430/293
[58] Field of Search ............... 430/143, 257, 293

[56] References Cited

U.S. PATENT DOCUMENTS

| | | |
|---|---|---|
| 3,671,236 | 6/1972 | Van Beusekom . |
| 3,721,557 | 3/1973 | Inoue . |
| 4,093,464 | 6/1978 | Ruckert et al. . |
| 4,260,673 | 4/1981 | Krech ..................... 430/143 |
| 4,656,114 | 4/1987 | Cederberg et al. ........... 430/160 |
| 4,659,642 | 4/1987 | Platzer et al. ............. 430/143 |
| 4,948,693 | 8/1990 | Shadrach et al. ........... 430/143 |

FOREIGN PATENT DOCUMENTS

| | | |
|---|---|---|
| 0115899 | 8/1984 | European Pat. Off. . |
| 0165030 | 12/1985 | European Pat. Off. . |
| 0357324 | 3/1990 | European Pat. Off. . |
| 1550524 | 8/1979 | United Kingdom . |
| 8606182 | 10/1986 | WIPO . |

*Primary Examiner*—Charles L. Bowers, Jr.
*Assistant Examiner*—Christopher G. Young
*Attorney, Agent, or Firm*—Palaiyur S. Kalyanaraman

[57] ABSTRACT

The invention relates to a positive-working colored photosensitive recording material for the production of a color test image, composed of a temporary layer carrier, a photosensitive layer containing dyestuff or pigment, binder and quinonediazide compound and an adhesive layer which can be activated by means of heat, wherein a release layer based on polyvinyl alcohol is present on the surface of the temporary layer carrier, the photosensitive layer comprises, as the quinonediazide compound, an esterification product of a compound containing one or more phenolic hydroxyl groups and o-quinonediazide-sulfonyl chloride, and, as the binder, a novolak-free phenolic polymer resin and/or a reaction product of the phenolic polymer resin with a monoisocyanate, and the adhesive layer comprises a alkali-insoluble organic polymer and an alkali-soluble polyester. The invention also relates to a process for the production of a color test image using the recording material described.

1 Claim, No Drawings

PROCESS FOR THE PRODUCTION OF A COLOR TEST IMAGE USING QUINONE DIAZIDE PHOTOSENSITIVE RECORDING MATERIAL

This is a divisional of application Ser. No. 07/939,909 filed on Sep. 4, 1992, now U.S. Pat. No. 5,348,833, which is a CIP of application Ser. No. 07/664,753 filed on Mar. 5, 1991 now abandoned.

BACKGROUND OF THE INVENTION

The present invention relates to a positive-working colored photosensitive recording material for the production of a color test image, composed of a temporary layer carrier, a photosensitive layer containing dyestuff or pigment, binder and quinonediazide compound and an adhesive layer which can be activated by means of heat, and to a process for the production of a color test image using this material.

Color testing is in general performed in multicolor printing to allow correction of the color separations used for exposure of printing plates. The color test image must be a true record of the required dot or line image and should reproduce the tone value of the colors in a form true to nature, i.e. in neither an increased nor reduced form. Visual color testing should indicate defects in the master, allow the best color reproduction to be expected by machine printing, reproduce the accurate gradation of all color shades and indicate whether the gray shades are neutral. It should furthermore indicate any need to attenuate one of the colors and/or give an indication to change the film master before production of the printing plates.

Color testing for multicolor printing has to date been carried out with the aid of color proofs. All the steps which are also needed for the actual multicolor printing must be taken in this process. Such a color test process is expensive and time consuming, and other color test processes have therefore been developed, which are intended to be of equivalent quality to the proof. Three color test processes using photosensitive color test films are known, the surprint process (laminating on top of one another), the surlay process (copying on top of one another), and the overlay process (laying on top of one another).

DE-A 2,712,864, corresponding to GB-A 1,550,524, describes a positive-working color film which consists of a transparent layer carrier, a layer containing a photosensitive diazonium salt and a thin color layer containing a dispersed pigment. A specific layer arrangement is characteristic of this color test film, and the layer containing the photosensitive diazonium compound should in all cases be above the color layer with respect to the exposure stage.

EP-A 0,035,028, corresponding to U.S. Pat. No. 4,260,673, relates, to a presensitized color test sheet which has the following layer build-up: a carrier sheet is covered with anon-stick coating, onto which a color layer is applied, followed by a novolak-containing binder layer which contains a reaction product of a resin and a diazo oxide and is free from pigments. This binder layer is then also followed by a barrier layer and a non-stick layer.

EP-A 0,217,792 relates to a process for improving the exposure range of positive-working color test films in which a colored release layer is used as an optical filter. A color test film which, in addition to the other layer build-up, also additionally contains one or more dyestuffs which effect protection from reflection ("antihalation layer") is known from EP-A 0,165,030.

EP-A 0,165,031, corresponding to U.S. Pat. No. 4,656,114, discloses a color test sheet in which, between the color layer and the adhesive layer, there is an additional water-insoluble transparent barrier layer which is intended to prevent diffusion from one color layer into another color layer after the adhesive layer has been dissolved.

The primary aim of these known color test processes is to produce a multicolor image which is as close as possible in appearance to the four-color print sought. The decisive disadvantage of these positive-working recording materials for the production of color test films seems to be that these materials use novolak resins in combination with quinonediazide processes as the photoreactive system. Since novolaks have a yellow to brown coloration, this unavoidably leads to a shift in color shade in the color test image to be produced. All the color test systems known to date which are based on precolored layers containing novolak are therefore to be regarded as a compromise between photoreactivity and color reproduction.

In EP-A 0,179,274, corresponding to U.S. Pat. No. 4,659,642, an attempt is made to avoid the color shift due to the intrinsic coloration of the novolak by using binders which are free from phenol groups. However, this does not yet lead to materials which are suitable in practice, since the differentiation between the solubility of the exposed and non-exposed regions is inadequate.

Various processes based on precolored layers are known for the production of color test films for the graphics industry. U.S. Pat. No. 3,671,236 describes a process in which separation images in the various base colors are combined in succession on a receiver sheet in accordance with the corresponding color separations to give a four-color overall image.

U.S. Pat. No. 3,721,557, corresponding to DE-B 1,912,864, describes a process for transferring color images, in which a peel-off layer is applied between the photosensitive layer and the layer carrier. When the photosensitive layer is developed, the soluble constituents of the layer are removed selectively and a visible image forms. The layer carrier with the image is pressed against a suitable receiver material coated with adhesive and the image is then transferred by peeling off the layer carrier. A fresh adhesive layer is applied to the receiver material for each further image transfer.

A color test process in which positive-working photosensitive layers, colored in the desired base colors and in each case on a temporary carrier film, are exposed and developed on this film is known from DE-A 2,236,941, corresponding to U.S. Pat. No. 4,093,464. The resulting separation images are transferred onto an image-receiving material, for example a printing paper, by lamination in register. This process has the disadvantage that lamination in register requires very precise work and is therefore very expensive. Furthermore, lamination of developed images can be carried out only with layers which are still sufficiently thermoplastic, i.e. as a rule only with positive-working layers which additionally also contain certain plasticizing additives.

According to EP-A 0,035,028, a multicolor test image is produced by laminating the multilayered material onto an image-receiving material, which is a paper with a water-proof finish, and exposing it on this material and developing it into the separation image. The other separation images are produced over the first in the same manner. Multicolor images in accurate register can be obtained more easily by this process, since it is merely necessary to perform the exposure in register. The process has the disadvantage that several layers on top of one another are required for each base color and that the image elements still each contain two layers containing non-decomposed colored diazo compound.

SUMMARY OF THE INVENTION

Accordingly, it is an object of the present invention to provide a photosensitive recording material for a multicolor proof which allows reproduction true to the color location and results in an adequate developer contrast between the exposed and non-exposed regions.

Another object of the present invention is to provide an improved process for the production of a color test image, using the improved colored photosensitive recording material.

In accomplishing the foregoing objectives, there has been provided, in accordance with one aspect of the present invention, a positive-working colored photosensitive recording material for the production of a color test image comprising: a temporary layer carrier; a release layer comprising polyvinyl alcohol on the surface of the temporary layer carrier; a photosensitive layer comprising (i) a dyestuff or pigment, (ii) a binder comprising a novolak-free phenolic polymer resin, a reaction product of said phenolic polymer resin with a monoisocyanate or a mixture thereof, and (iii) an esterification product of a compound containing at least one phenolic hydroxyl group and o-quinonediazide sulfonyl chloride; and an adhesive layer which is activatable by means of heat and which comprises an alkali-insoluble organic polymer and an alkali-soluble polyester.

In accordance with another aspect of the present invention there is provided a process for producing a color test image comprising the steps of: (a) providing a permanent layer carrier; (b) laminating to the layer carrier a recording material as described above via the adhesive layer of the recording material, wherein the photosensitive layer of the recording material comprises at least one dyestuff or pigment of a base color selected from the group consisting of cyan, magenta, yellow and black; (c) peeling off the temporary layer carrier of the recording material; (d) exposing the recording material under a color separation corresponding to the color; (e) developing the recording material to produce a separation image; (f) laminating to the separation image another recording material as described above via its adhesive layer, wherein the photosensitive layer of the recording material comprises at least one dyestuff or pigment of a different base color; and (g) producing additional separation images for each remaining base color and black by sequentially repeating steps (c)–(f), whereby a complete four-color image is formed.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

According to the invention, a positive-working colored photosensitive recording material of the type mentioned at the beginning comprises a release layer based on polyvinyl alcohol present on the surface of the temporary layer carrier, a photosensitive layer containing, as the quinonediazide compound, an esterification product of a compound containing one or more phenolic hydroxyl groups and o-quinonediazide-sulfonyl chloride, and, as binder, a novolak-free phenolic polymer resin and/or a reaction product of the polymer resin with a monoisocyanate, and an adhesive layer containing or composed of a styrene-butadiene copolymer and an alkali-soluble polyester.

Partly hydrolyzed polyvinyl acetates, in particular those having a degree of hydrolysis of about 80 to 90 mol percent, are suitable for the release layer based on polyvinyl alcohol.

The novolak-free phenolic polymer resin is preferably a polymer having phenolic groups in the side chain, comprising units corresponding to the general formula I

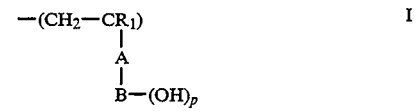

in which
$R_1$ is hydrogen or a methyl group,
A is a single bond or the group

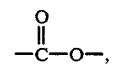

B is an optionally substituted mono- or polynuclear carbocyclic aromatic ring system,
p is 1 or 2.

A binder which is a polymer corresponding to the general formula I, in which
$R_1$ is hydrogen or a methyl group,
A is a single bond or the group

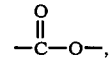

and
B is phenylene or naphthylene, which can be substituted by lower alkyl, lower alkoxy, aryl or halogen,
is employed in particular.

The novolak-free phenolic polymer resin is preferably a binder which further comprises units according to formula II

in which
$R_2$ is hydrogen or a carboxyl group,
$R_3$ is hydrogen, alkyl or a halogen atom,
$R_4$ is alkyl, alkoxy, alkoxycarbonyl, acyl, acyloxy, aryl, formyl, cyano, carboxyl or hydroxyl, and if $R_2$ is a carboxyl group, can be bonded thereto to form an acid anhydride.

A binder which is a polymer corresponding to the formula II, in which $R_2$ is hydrogen or a carboxyl group, $R_3$ is hydrogen, $(C_1-C_{12})$-alkyl, or a halogen atom, $R_4$ is alkyl, alkoxy or alkoxy carbonyl having in each case 1 to 4 carbon atoms, acyl, acyloxy, aryl, formyl, cyano, carboxyl or hydroxyl, and if $R_4$ is carboxyl group, can be bonded to this to form an acid anhydride, is employed in particular.

The novolak-free phenolic polymer resin is preferably a binder comprising units of formula I from about 60 to 100 mol percent and units of formula II from about 0 to 40 mol percent.

Particularly suitable polymer resins as binders are homopolymers of pyrocatechol monomethacrylate, resorcinol monomethacrylate, resorcinol monomethacrylate, hydroquinone monomethacrylate and 4-hydroxystyrene or copolymers thereof. These resins can be present by themselves or as a mixture.

The polymer resin employed as the binder can be prepared by conventional methods, for example in the presence of a polymerization initiator, such as azo-bis-isobutyronitrile, in organic solvents such as tetrahydrofuran or methyl ethyl ketone, at elevated temperatures in the course of 1 to 20 hours. However, suspension or bulk polymerization, which can be triggered off by radiation, heat or ionic initiators, is also possible. The polymers containing units of the formula I can be homopolymers or copolymers corresponding to the formula I and II. i.e. including one or more vinyl monomers, if appropriate also those containing phenolic groups. Examples of these are styrene, chlorostyrene, α-methylstyrene, 3- or 4-chloromethylstyrene, 4-bromostyrene, methyl vinyl ether, ethyl vinyl ether, propyl vinyl ether, butyl vinyl ether, acrylonitrile, acrolein, butadiene, acrylic acid, methacrylic acid, the methyl, ethyl, propyl, butyl, pentyl, hexyl, octyl, decyl, dodecyl, 2-ethylhexyl, phenyl, benzyl, biphenyl or naphthyl esters of these acids, methacrylamide, acrylamide, vinyl acetate, vinyl isobutyl ketone and maleic anhydride. Comonomers containing phenolic hydroxyl groups preferably have the following structure:

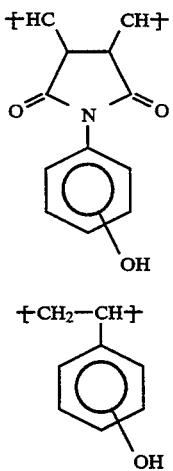

The molecular weight of the polymer can be varied within wide limits. Polymers where M=about 20,000–50,000 are preferred here.

The hydroxyl number is in general in the range from about 100 to 450, preferably between about 200 and 350.

The proportion of units containing phenolic hydroxyl groups in the polymer depends on the photosensitivity in practice of the various colored photosensitive layers. The proportion is furthermore determined by rapid development with aqueous-alkaline solutions and by the highest possible resistance of the non-exposed regions to developer. The desired hydrophilicity is established by reaction of the OH groups with, for example, monoisocyanates. Examples of suitable isocyanates are butyl isocyanate, cyclohexyl isocyanate and n-propyl isocyanate. The monoisocyanate used for the reaction product with the phenolic polymer resin is preferably phenyl isocyanate.

The amount of monoisocyanate is in the range from about 0 to about 30 percent by weight, based on the polymer present.

The binder is present in the colored photosensitive layer in an amount of about 20 to 75, preferably about 30 to 70, percent by weight, based on the non-volatile contents of the layer.

To prepare the mixtures according to the invention for the photosensitive layer, the binder described is combined with a color-donating component and a photosensitive compound. These include, above all, o-quinonediazides. oQuinonediazides which can be present are condensation products of a compound having one or more phenolic hydroxyl groups and 1,2naphthoquinone-2-diazide-4-sulfonic acid chloride, 1,2-naphthoquinone-2-diazide-5-sulfonic acid chloride or 1,2-naphthoquinone-2-diazide-6-sulfonic acid chloride. The compounds containing one or more phenolic hydroxyl groups include, for example, trihydroxybenzophenone, bisphenol A or 4-tert.butylphenol. The o-quinonediazides which are preferably used are esterification products of 1,2-naphthoquinone-2-diazide-4-sulfonic acid chloride with 2,3,4-trihydroxybenzophenone, which cause no color shift in the color test film after exposure. The mono-, bis- and triesters are possible esterification products of 2,3,4-trihydroxybenzophenone and 1,2-naphthoquinone 2-diazide-4sulfonic acid chloride. The trisester is especially preferably employed. The amount of o-quinonediazide compound is in general about 10–30%, based on the non-volatile constituents of the photosensitive mixture.

The coloring agents which are suitable according to the invention include various classes of dyestuffs and pigments in the base colors of magenta, cyan, yellow and black. Mixtures of the various dyestuffs or pigments can also be used to achieve certain color shades. In the most preferred embodiment, pigments having an average particle size of not more than about 1 μm are employed.

The individual components are dissolved in compatible solvents, such as, for example, propylene glycol monomethyl ether, ethylene glycol monomethyl ether, γ-butyrolactone and methylglycol and the solution is applied to the surface of the temporary layer carrier and dried. The photosensitive layer has a layer weight of about 0.5 to 5.0 g/m². The layer weight is, in particular, between about 0.8 and 2.0 g/m².

The temporary layer carrier must have at least one non-stick surface, i.e., it must be capable of holding the photosensitive layer so that it can be released from it again. For this purpose, either the layer carrier surface can be non-stick in nature, it can be rendered non-stick by a suitable treatment, or it can be provided with a release layer. A layer based on polyvinyl alcohol is preferably used according to the invention as such a release layer. Suitable polymers include, for example, polyvinyl alcohol and partial esters thereof, polyvinyl ethers and acetates, and copolymers of vinyl alcohol and olefins, which can be employed by themselves or as a mixture. A partly hydrolyzed polyvinyl acetate having a degree of hydrolysis of about 80 to 90 mol percent is preferably used as the polymer for the release layer. The release layer has a dry layer weight in the range from about 0.5 to 2 g/m².

The adhesive layer which can be activated by means of heat and the softening point of which here should be less than about 160° C., preferably less than 100° C., is preferably composed of an alkali-insoluble organic polymer and an alkali-soluble polyester resin. The adhesive layer moreover should not be tacky at room temperature. The alkali-insoluble organic polymers include, for example, polyvinyl acetate, polyacrylic acid esters, acrylic acid ester copolymers, polymethacrylic acid esters, methacrylic acid ester copolymers, polyvinyl chloride, vinyl chloride copolymers, polystyrene, stryene copolymers and ethylene copolymers (for example ethylene/vinyl acetate copolymers or ethylene/acrylic acid copolymer).

The alkali-soluble polyesters include polyesters which are alkali soluble per se, for example, because they contain a sufficient amount of free carboxyl groups, and also polyesters which are dissolved after a period of standing in dilute aqueous-alkaline solutions. The latter type are, for example, OH-terminal polyesters.

The alkali-soluble polyesters, in general, have molecular weights in the range from about 1000 to 10000. Their consistency may range from viscous liquids to soft solids. The polyesters are obtained by esterification of dicarboxylic acids, e.g., adipic acid, phthalic acid etc., with diols, e.g., ethylene glycol, propylene glycol, butane diol etc. They may, in addition contain minor proportions of tri- or tetracarboxylic acid units as well as triols or tetraols. A preferred polyester is a product commercially available as "Desmophen 1700" which is a linear high viscosity liquid polyester of a diol and dicarboxylic acid with terminal OH-groups and a molecular weight in the order of about 3000. This polyester has a hydroxyl content of about 1.2%; a color number according to DIN 6162 (50% in ethylene glycol acetate) of at most 5; a flash point according to DIN 51 758 of more than 200° C.; a density of 20° C. according to DIN 53 217 of about 1.19 g/cm³; viscosity at 23° C. in 70% ethylene glycol acetate of 575±75 mPa s (velocity gradient D≈190 s⁻¹); and a water content of less than 0.15%.

The adhesive layer contains about 70-99, preferably about 60-95 percent by weight of styrene-butadiene copolymer and about 1 30, preferably about 5-40 percent by weight of alkalisoluble polyester.

If appropriate, the materials described above can also contain other components, such as, for example, UV absorbers, antistatics and plasticizers.

The adhesive layer is usually applied to the photosensitive layer from an organic solvent. Mixing of the two layers is avoided here by using a solvent which does not attack the lower photosensitive layer. The dry weight of the adhesive layer is in the range from about 2 to 20 g/m², preferably from about 3 to 10 g/m².

The layers which have been exposed image-wise can be developed with aqueous-alkaline solutions in a known manner. The aqueous developer solutions can contain, for example, alkali metal phosphates, silicates or hydroxides and furthermore wetting agents, as well as small amounts of organic solvents.

In a process for the production of a color test image using a colored photosensitive recording material according to the invention, a recording material in the first base color is laminated on the adhesive layer side thereof onto a permanent layer carrier with the aid of pressure and heat, the temporary layer carrier is peeled off, the recording material is exposed under the color separation onto the corresponding base color and developed, and separation images of the other base colors and of black are further produced over the resulting separation image in a corresponding manner, the complete four-color image being formed.

To produce a color test image, the laminate is laminated via the adhesive layer onto a permanent layer carrier under pressure and by heating, the photosensitive layer is exposed image-wise, after the temporary layer carrier has been removed, and the exposed layer is developed by washing out the exposed regions. To produce a complete color test image, another photosensitive recording material in a different base color is laminated onto the image produced beforehand on the same permanent layer carrier. In order to obtain the entire color reproduction, four layers are usually used, in the colors cyan, magenta, yellow and black.

The photosensitive layer according to the invention is particularly suitable for the production of color test images on a suitable permanent layer carrier material, since it avoids a shift in the color of the color test image due to novolaks by using colorless polymer resins which, as a result of their content of phenolic groups, have a solution-inhibiting effect, like novolaks, on quinonediazide compounds and are significantly superior to resins containing no phenolic groups in their photoreaction.

The photosensitivity in practice can moreover be adjusted according to the invention by modifying the phenolic hydroxyl groups with monoisocyanates.

Films of plastic, for example polyester films or paper coated with plastic, can be used as permanent layer carriers. The surface of the permanent layer carrier preferably has a rough surface and/or has been treated with an adhesion promotor. The permanent layer carrier must be insensitive towards the laminating and developing operations.

The result of the invention is that a positive-working colored photosensitive recording material which guarantees a color reproduction which is true to nature, is easy to handle in a simple process, and has a broad processing tolerance and good developer resistance of the non-exposed regions can be provided for production of a color test image.

The invention is illustrated in more detail with the aid of the following examples, without limiting it to these. Unless stated otherwise, all the parts and percentage data are based on the weight.

The following example relates to the production of a color test film colored cyan.

EXAMPLE 1

A release layer which has a dry weight of 0.7–1.0 g/m² is applied to a polyethylene terephthalate film 50 μm thick as the temporary layer carrier. The solution is knife-coated on and dried at 100° C. in a drying cabinet for 3 minutes.

| Coating solution A | |
|---|---|
| Polyvinyl alcohol (Molecular weight = 530, degree of hydrolysis 88 mol %) | 120.0 g |
| Polyvinyl alcohol (Molecular weight = 1000 degree of hydrolysis 88 mol %) | 120.0 g |
| Nonylphenol polyglycol ether | 6.7 g |
| deionized water | 6.8 kg |

In the subsequent step, the colored photosensitive layer is applied to the release layer with the aid of a whirler. The coating solution for the photosensitive layer is prepared in two stages. The pigment dispersion is first prepared.

| Coating solution B | |
|---|---|
| Polyvinylpropional resin containing 13.6% of vinyl acetate groups, 9.8% of vinyl alcohol groups and 76.6% of vinylpropional groups | 5.5% |
| Hosterpermblau B2G blue pigment, Color Index (C.I.) 74160 | 6.5% |
| Propylene glycol monomethyl ether | 44.0% |
| γ-Butyrolactone | 44.0% |
| Coating solution C | |
| Polymer of pyrocatechol monomethacrylate (Reduced specific viscosity value: 0.210 in dimethylformamide [DMF]) | 12.5 g |
| Coating solution B | 6.5 g |
| Esterification product of 1 mol of 2,3,4-trihydroxybenzophenone and 3 mol of 1,2-naphthoquinone 2-diazide-4-sulfonic acid chloride | 1.1 g |
| Propylene glycol monomethyl ether | 36.4 g |
| Tetrahydrofuran | 43.5 g |

The solution is whirler-coated onto the film, which has been provided with a release layer, such that a layer weight of 1.5 g/m$^2$ is established after drying (2 minutes, 110° C.). The color density, measured through a blue filter using a Gretag densitometer, is 1.2.

Finally, an adhesive layer composed of 97 percent by weight of a styrene-butadiene copolymer (glass transition temperature=50° C.) and 3 percent by weight of an alkali-soluble polyester (Desmophen®1700, BAYER AG) is also applied, with a dry weight of 3 g/m$^2$, onto the colored photosensitive layer.

The color test film thus obtained is laminated with the adhesive layer onto a receiver sheet as the permanent layer carrier. Suitable laminating temperatures are in the range from 110° to 140° C. After the lamination, the film as the temporary layer carrier is peeled off. The adhesive layer and the colored photosensitive layer remain on the permanent layer carrier during this operation.

The photosensitive layer is then exposed image-wise in a known manner. It can be exposed, for example, through a photomask in a vacuum copying frame using a UV light source.

After the exposure, the layer is developed with an aqueous-alkaline solution composed of

| Water | 92 parts by weight |
|---|---|
| Sodium octylsulfate | 3 parts by weight |
| Potassium metasilicate | 3 parts by weight |
| Phenoxyethanol | 1 parts by weight |
| Trisodium phosphate | 1 parts by weight | the soluble portions of the layer which have been affected by the light being removed.

A true reproduction of the original color separation is obtained.

To produce a complete color image, in the same manner and in successive operations, a magenta, a yellow and a black colored film are each laminated on, the particular temporary layer carrier is peeled off and the layer is exposed and developed, so that accurate reproduction of the original from which the color separations have been prepared is effected.

EXAMPLES 2–7

For comparison, the polymer from Example 1 is modified with the amounts of phenyl isocyanate stated in the table and a color test film is produced and in each case developed with the same developer solution analogously to Example 1. The polymers used and the open wedge steps in the UGRA wedge for the same exposure times, as well as the resolutions for the individual layers are summarized in Table 1.

TABLE 1

| Example | % by weight of phenyl isocyanate | Open step | μ-line still visible |
|---|---|---|---|
| 2 | 0.9 | 5 | 55 |
| 3 | 1.8 | 4 | 40 |
| 4 | 3.6 | 3 | 30 |
| 5 | 5.5 | 2 | 25 |
| 6 | 7.3 | 2 | 15 |
| 7 | 9.1 | 1 | 8 |

The table shows that the hydrophilicity of the imaging layer can easily be varied by the amount of pheny isocyanate.

EXAMPLES 8–11

To produce a color test film, the following binders are mixed in accordance with the data for coating solution C with the components stated for that solution:

8) Copolymer of pyrocatechol monomethacrylate and methyl acrylate (90:10 mol %, reduced specific viscosity value: 0.438 dl/g in dimethylformamide)
9) Copolymer of hydroquinone monomethacrylate and nbutyl methacrylate (70:30 mol %, reduced specific viscosity value: 0.365 dl/g in dimethylformamide)
10) Copolymer of resorcinol monomethacrylate and 2-ethylhexyl methacrylate (68:32 mol %, reduced specific viscosity: 0.589 dl/g in dimethylformamide)
11) Copolymer of 4-hydroxystyrene and n-butyl methacrylate (70:30 mol %, reduced specific viscosity: 0.321 dl/g in dimethylformamide)

After the lamination, exposure and development, a true reproduction of the original color separation is obtained.

The copolymers employed in the open wedge steps in the UGRA wedge for the same exposure times, as well as the resolutions for the individual layers, are summarized in Table 2.

TABLE 2

| Example | Open step | μ-line standing |
|---|---|---|
| 8 | 4 | 40 |
| 9 | 2 | 8 |
| 10 | 2 | 8 |

TABLE 2-continued

| Example | Open step | μ-line standing |
|---------|-----------|-----------------|
| 11      | 6         | 70              |

What is claimed is:

1. A process for producing a color test image comprising the steps of
   (a) providing a permanent layer carrier;
   (b) laminating to said permanent layer carrier a positive-working colored photosensitive recording material which recording material comprises (i) a temporary layer carrier, (ii) a release layer comprising polyvinyl alcohol on the surface of said temporary layer carrier, (iii) a photosensitive layer comprising at least one dyestuff or pigment of a base color selected from the group consisting of cyan, magenta, yellow and black, a binder comprising a novolak-free phenolic polymer resin, a reaction product of said phenolic polymer resin with a monoisocyanate or a mixture thereof, and an esterification product of a compound containing at least one phenolic hydroxyl group and o-quinonediazide sulfonyl chloride, and (iv) an adhesive layer activatable by means of heat which comprises an alkali-insoluble organic polymer and an alkali-soluble polyester, wherein said lamination is performed via the adhesive layer of said photosensitive recording material;
   (c) peeling off the temporary layer carrier of said recording material;
   (d) exposing said recording material under a color separation corresponding to said base color;
   (e) developing said recording material with a suitable aqueous developer to produce a separation image;
   (f) laminating to said separation image a recording material as claimed in step (b) above via the adhesive layer of said recording material, wherein the photosensitive layer of said recording material comprises at least one dyestuff or pigment of a different base color; and
   (g) producing additional separation images for each remaining base color by sequentially repeating steps (c)–(f), whereby a complete four-color image is formed.

* * * * *